(12) United States Patent
Ueyama

(10) Patent No.: US 9,485,855 B2
(45) Date of Patent: Nov. 1, 2016

(54) SUBSTRATE REINFORCING STRUCTURE

(71) Applicant: ENPLAS CORPORATION, Kawaguchi-shi, Saitama (JP)

(72) Inventor: Yuki Ueyama, Kawaguchi (JP)

(73) Assignee: ENPLAS CORPORATION, Kawaguchi-Shi, Saitama (JP)

( * ) Notice: Subject to any disclaimer, the term of this patent is extended or adjusted under 35 U.S.C. 154(b) by 0 days.

(21) Appl. No.: 14/776,389

(22) PCT Filed: Mar. 6, 2014

(86) PCT No.: PCT/JP2014/055735
§ 371 (c)(1),
(2) Date: Sep. 14, 2015

(87) PCT Pub. No.: WO2014/141990
PCT Pub. Date: Sep. 18, 2014

(65) Prior Publication Data
US 2016/0037627 A1    Feb. 4, 2016

(30) Foreign Application Priority Data
Mar. 15, 2013  (JP) .................. 2013-053610

(51) Int. Cl.
*H01R 13/648* (2006.01)
*H05K 1/02* (2006.01)
(Continued)

(52) U.S. Cl.
CPC .......... *H05K 1/0271* (2013.01); *H05K 1/0313* (2013.01); *H05K 1/115* (2013.01);
(Continued)

(58) Field of Classification Search
CPC .. H05K 1/0271; H05K 1/0313; H05K 1/115; H05K 3/0061; H05K 3/3447; H05K 2201/2009; H05K 2201/10409; H05K 2201/10325; H05K 1/02; H05K 1/11; H05K 1/03; G01R 31/2863; H01R 12/716
USPC ..................... 439/607.14; 174/262
See application file for complete search history.

(56) References Cited

U.S. PATENT DOCUMENTS 7,944,143 B2 *   5/2011  Choi ................... C03C 8/24
                                          313/512
8,092,231 B2     1/2012  Suzuki

FOREIGN PATENT DOCUMENTS

JP      3-6892       1/1991
JP      6-33089      4/1994
(Continued)

OTHER PUBLICATIONS

Machine translation of JP 7 2981.*
(Continued)

*Primary Examiner* — Javaid Nasri
(74) *Attorney, Agent, or Firm* — Staas & Halsey LLP

(57) ABSTRACT

A substrate reinforcing structure for preventing and suppressing deformation or the like of a substrate with a fixed electric component socket.

A first reinforcing plate in, for example, a frame shape is attached to a back surface of a wiring board. Further, a second reinforcing plate in, for example, a flat shape is provided on a back side of the first reinforcing plate. In a preferred embodiment of the present invention, a first insulating sheet is further provided between the wiring board and the first reinforcing plate, and a spacer is provided on the second reinforcing plate and abutted to a part of the wiring board where contact pins do not protrude. A second insulating sheet is further provided on the second reinforcing plate.

5 Claims, 8 Drawing Sheets

(51) Int. Cl.
*H05K 3/00* (2006.01)
*H05K 1/03* (2006.01)
*H05K 1/11* (2006.01)
*H01R 12/71* (2011.01)
*G01R 31/28* (2006.01)
*H05K 3/34* (2006.01)

(52) U.S. Cl.
CPC ....... *H05K 3/0061* (2013.01); *G01R 31/2863* (2013.01); *H01R 12/716* (2013.01); *H05K 3/3447* (2013.01); *H05K 2201/10325* (2013.01); *H05K 2201/10409* (2013.01); *H05K 2201/2009* (2013.01)

(56) References Cited

FOREIGN PATENT DOCUMENTS

| | | |
|---|---|---|
| JP | 7-2981 | 1/1995 |
| JP | 7-63817 | 3/1995 |
| JP | 2528084 | 12/1996 |
| JP | 2003-86279 | 3/2003 |
| JP | 2011-71029 | 4/2011 |

OTHER PUBLICATIONS

Machine translation of JP 3 6892.*
International Search Report mailed May 13, 2014, in corresponding International Application No. PCT/JP2014/055735.

* cited by examiner

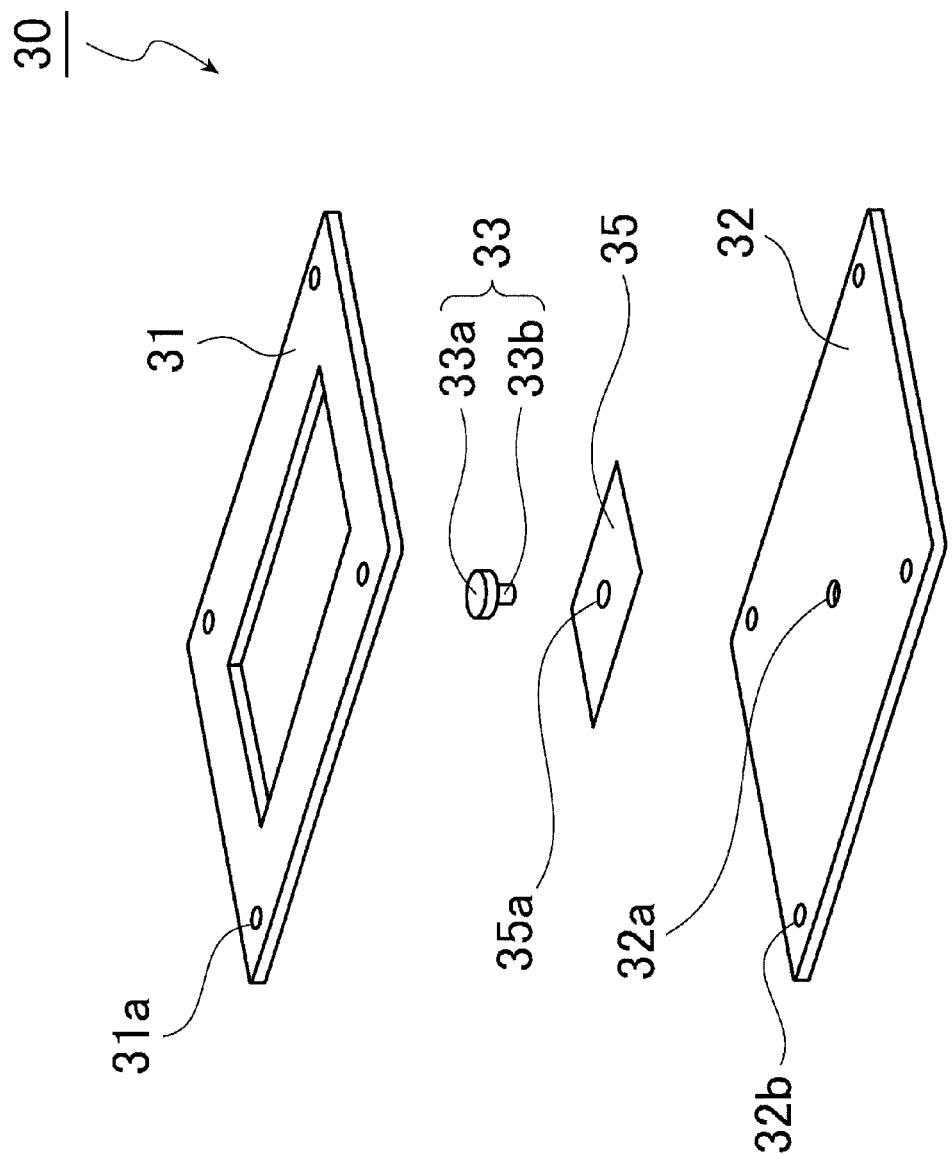

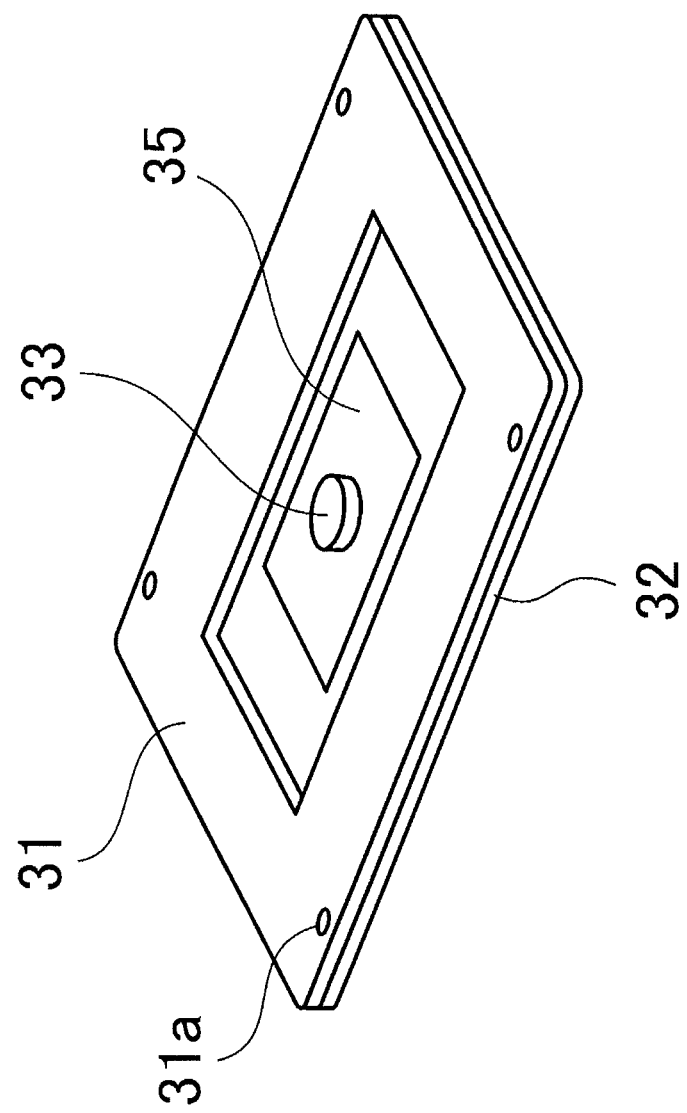

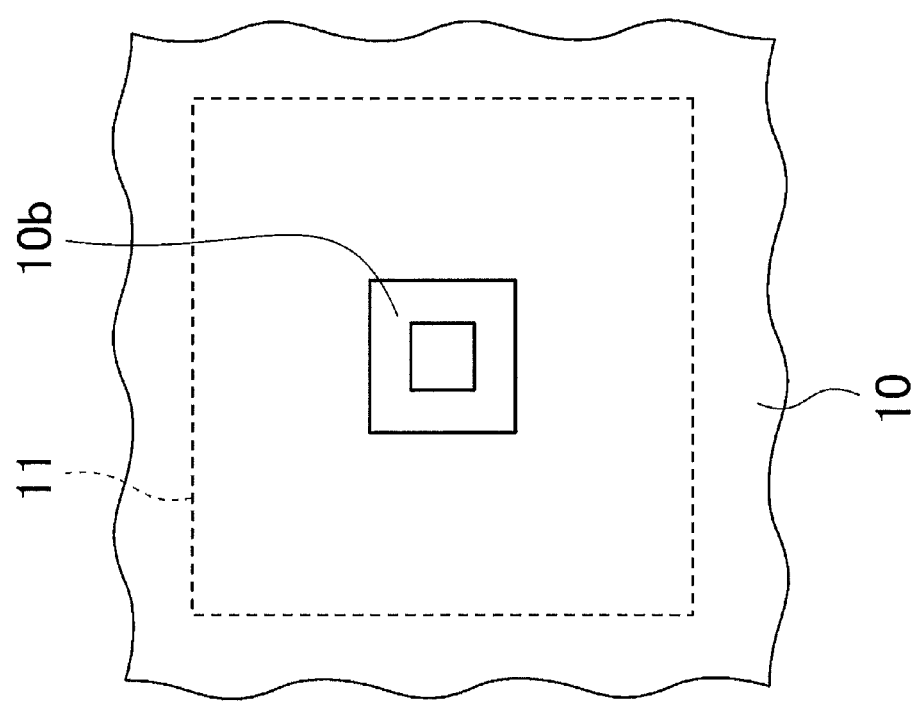

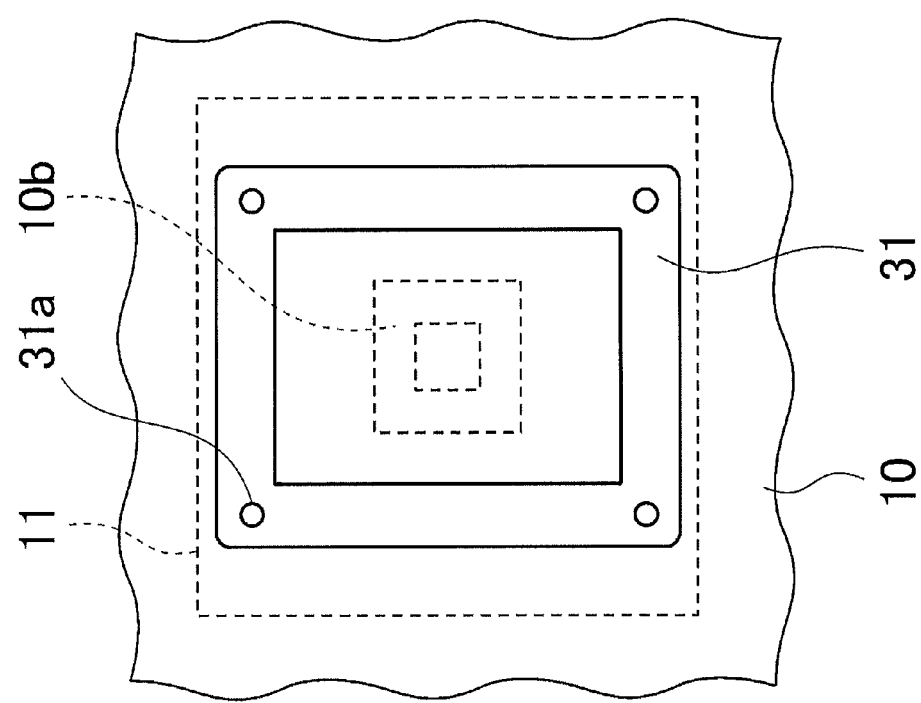

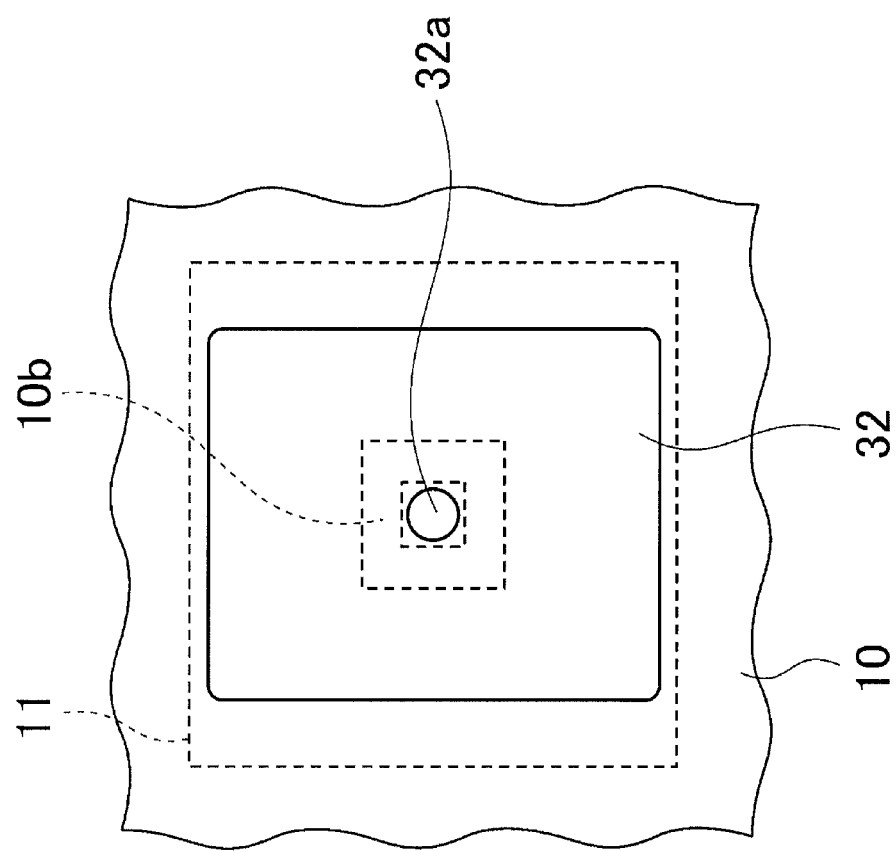

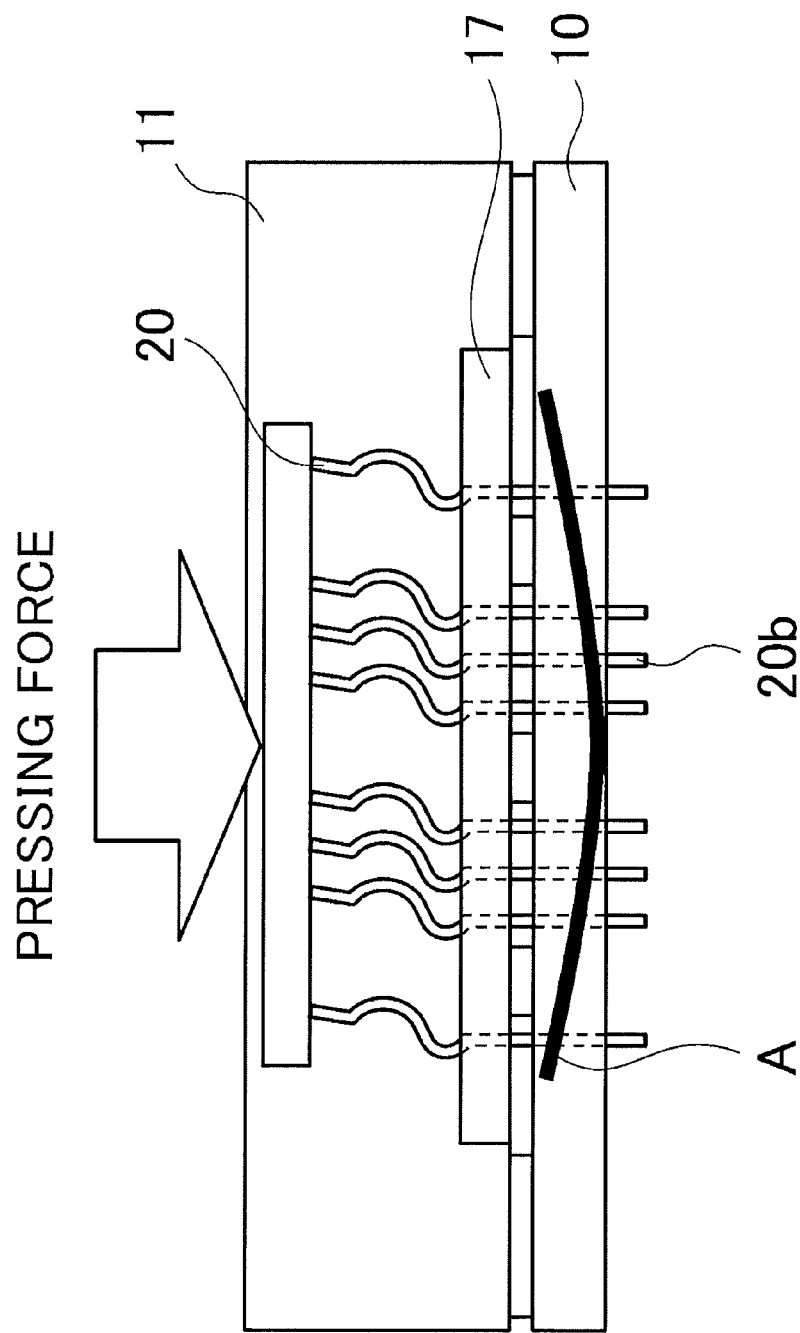

SUBSTRATE REINFORCING STRUCTURE

CROSS REFERENCE TO RELATED APPLICATIONS

This application is based on and hereby claims priority to International Application No. PCT/JP2014/055735 filed on Mar. 6, 2014 and Japanese Application No. 2013-053610 filed on Mar. 15, 2013, the contents of which are hereby incorporated by reference.

TECHNICAL FIELD

The present invention relates to a substrate reinforcing structure for preventing and suppressing deformation or the like of a substrate with a fixed electric component socket. The substrate reinforcing structure according to the present invention can be applied to, for example, a wiring board with a fixed IC socket.

BACKGROUND ART

An example of a conventionally known electric component socket includes an IC socket described in Japanese Patent Laid-Open No. 2011-71029 (hereinafter called 'Patent Literature 1').

The IC socket of Patent Literature 1 is used in, for example, a performance test such as a burn-in test. The IC socket includes a large number of contact pins. The contact pins are used to electrically connect a terminal of an IC package and a printed wiring board. Lower contact portions of the contact pins protrude from the lower surface of the IC socket. The lower contact portions are inserted to through holes of the wiring board and soldered to mount the IC socket on the wiring board (see FIG. 2 and the like of Patent Literature 1).

In a state before the IC package is set, a pressing member of the IC socket is opened like a double door (see FIG. 4 and the like of Patent Literature 1). After the IC package is accommodated in a accommodation portion, the pressing member is rotated and closed. As a result, the pressing member can press and fix the IC package from above.

In Patent Literature 1, contact pins provided with shallow arc-like curved spring portions are used. Providing the curved spring portions can maintain an appropriate contact pressure at contact points of the terminal of the IC package and the contact pins.

SUMMARY OF INVENTION

Technical Problem

However, when the IC socket of Patent Literature 1 is mounted on the wiring board, there is a drawback that the wiring board is easily deformed due to the following reason.

The IC socket of Patent Literature 1 includes a large number of contact pins provided at a narrow pitch within a certain range. The lower contact portions of the contact pins are inserted to inserting holes of the wiring board and fixed by soldering.

Therefore, when the IC package is accommodated in the accommodation portion and pressed by the pressing member, the pressing force presses the contact pins downward. Thus, the lower contact portions attempt to curve the wiring board downward. The pressing force is continuously applied to the wiring board during the performance test or the like after the IC package is set on the IC socket. As a result, the wiring board is easily warped.

Deformation of the wiring board causes a poor contact or the like of the contact pins and the IC package terminal.

The present invention has been made to solve the problem, and an object of the present invention is to provide a substrate reinforcing structure for preventing and suppressing deformation or the like of a substrate with a fixed electric component socket.

Solution to Problem

To solve the problem, the present invention provides a substrate reinforcing structure used to a substrate including an inserting hole formation area provided with a plurality of contact pin inserting holes, an upper surface of which an electric component socket is installed, and contact pins of the electric component socket are fixed in a state in which the contact pins are inserted to the contact pin inserting holes, wherein the substrate reinforcing structure including: a first reinforcing plate attached to a lower surface side of the substrate so as to surround the inserting hole formation area; and a second reinforcing plate provided on a lower side of the first reinforcing plate so as to cover an area surrounded by the first reinforcing plate.

It is desirable that the present invention further includes a spacer attached to an upper surface of the second reinforcing plate to support a lower surface of the substrate in the area surrounded by the first reinforcing plate and at a position without the insertion of the contact pins.

It is desirable that in the present invention, the first reinforcing plate is a frame-like flat plate surrounding an entire circumference of the area provided with the inserting holes, and the second reinforcing plate is a flat plate blocking the area surrounded by the first reinforcing plate.

It is desirable that in the present invention, a first insulating sheet is arranged between the lower surface of the substrate and an upper surface of the first reinforcing plate.

It is desirable that in the present invention, a second insulating sheet is arranged on the upper surface of the second reinforcing plate.

Advantageous Effects of Invention

According to the present invention, the first reinforcing plate is attached to the lower surface side of the substrate so as to surround the inserting hole formation area, and the second reinforcing plate covering the first reinforcing plate is provided on the lower side of the first reinforcing plate. As a result, even if the contact pins protrude from the lower surface of the substrate, the second reinforcing plate can be attached without contacting the contact pins. The first and second reinforcing plates can prevent and suppress deformation of the substrate.

In the case the present invention is provided with the spacer, the substrate can also be supported at the position provided with the spacer in addition to the part provided with the first reinforcing plate on the lower surface of the substrate. Therefore, the deformation of the substrate can be sufficiently prevented and suppressed even if the area of the inserting hole formation area is wide.

In the case the first reinforcing plate is a frame-like flat plate, and the second reinforcing plate is a flat plate, the present invention can further increase the advantageous effect of preventing and suppressing the deformation of the substrate.

In the case the first insulating sheet is provided between the substrate and the first reinforcing plate, the present invention can prevent inconvenience, such as a short circuit of the substrate, even if the first reinforcing plate is formed by a conductive material, such as metal.

In the case the second insulating sheet is provided on the second reinforcing plate, the present invention can prevent a contact pin from coming into contact with the second reinforcing plate and can prevent a short circuit with another contact pin.

BRIEF DESCRIPTION OF DRAWINGS

FIG. 2A is an exploded perspective view schematically showing the substrate reinforcing structure according to the first embodiment.

FIG. 2B is a perspective view of a state in which the substrate reinforcing structure according to the first embodiment is assembled.

FIG. 3A is a conceptual bottom view for describing the substrate reinforcing structure according to the first embodiment, showing a state before first and second reinforcing plates are attached to a wiring board.

FIG. 3B is a conceptual bottom view for describing the substrate reinforcing structure according to the first embodiment, showing a state in which the first reinforcing plate is attached.

FIG. 3C is a conceptual bottom view for describing the substrate reinforcing structure according to the first embodiment, showing a state in which the second reinforcing plate is attached.

FIG. 4A is a cross-sectional view for describing advantageous effects of the substrate reinforcing structure according to the first embodiment, showing a conventional structure.

DESCRIPTION OF EMBODIMENTS

First Embodiment of Invention

Hereinafter, a first embodiment of the present invention will be described with reference to FIGS. 1 to 4B.

Figure 1:
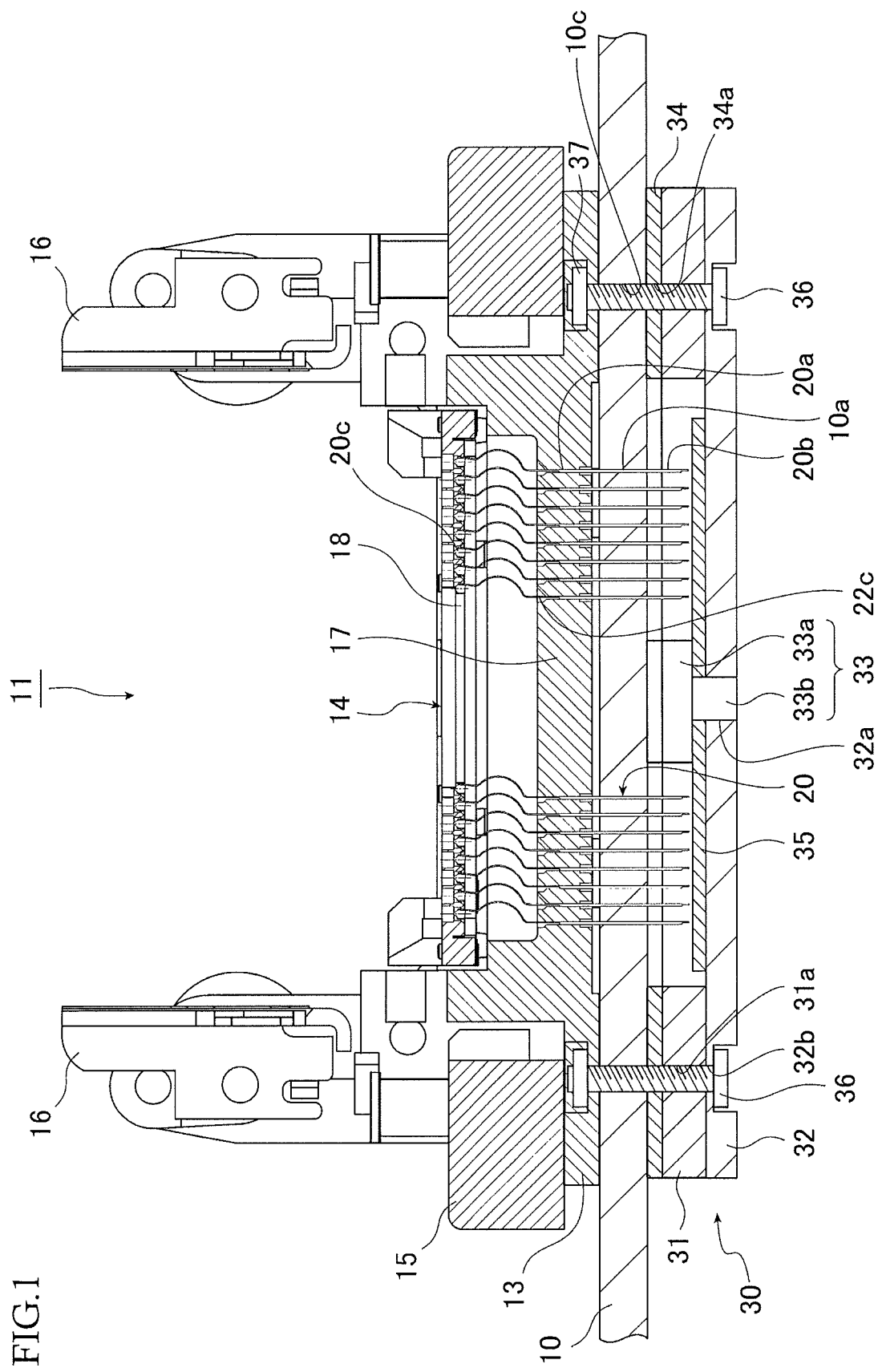
FIG. 1 is a cross-sectional view schematically illustrating an entire structure of a substrate and the like in which a substrate reinforcing structure according to a first embodiment of the present invention is applied.

As shown in FIG. 1, an IC socket 11 as an "electric component socket" is mounted on an upper surface of a wiring board 10 as a "substrate". A substrate reinforcing structure 30 is attached to a lower surface of the wiring board 10. The structure of the IC socket 11 is similar to that of the IC socket described in Patent Literature 1.

The IC socket 11 includes a socket main body 13 made of a synthetic resin mounted on the wiring board 10. A accommodation portion 14 is formed on the socket main body 13, and an IC package (not shown) is accommodated in the housing portion 14.

An operation member 15 and a pressing member 16 are further provided on the socket main body 13. When the operation member 15 is pushed down, the pressing member 16 is opened like a double door (see FIG. 1), and the IC package can be accommodated in and taken out from the accommodation portion 14. On the other hand, when the operation member 15 is pushed up, the pressing member 16 revolves to press the IC package accommodated in the accommodation portion 14 from above (not shown).

A large number of contact pins 20 are attached to a base member 17 of the socket main body 13. A press-fitting portion 20a of the contact pin 20 is pressed and fixed to a press-fitting hole 22c provided on the base member 17 of the IC socket 11. A lower contact portion 20b is inserted to a contact pin insertion hole 10a of the wiring board 10 and is fixed by soldering. Here, the contact pin insertion hole 10a is arranged in a frame-like insertion hole formation area 10b as shown in a bottom view of FIG. 3A. An upper contact portion 20c is arranged in an inserting hole of a floating plate 18 and is abutted to a terminal of the IC package from below.

The wiring board 10 includes a plurality of bolt through holes 10c.

As shown in FIGS. 1 to 3C, the substrate reinforcing structure 30 includes a first reinforcing plate 31, a second reinforcing plate 32, a spacer 33, a first insulating sheet 34 (not shown in FIGS. 2A and 2B), and a second insulating sheet 35.

The first reinforcing plate 31 is, for example, a frame-like plate material and is formed by a material with sufficiently high rigidity (for example, stainless steel). As shown in a bottom view of FIG. 3B, the first reinforcing plate 31 is attached to the lower surface (back surface) of the wiring board 10 so as to surround the inserting hole formation area 10b. The first reinforcing plate 31 includes a plurality of bolt through holes 31a.

The first reinforcing plate 31 may not be formed by one frame-like plate material, and the first reinforcing plate 31 may have a structure including a plurality of components using a pair of U-shaped plate materials, for example. However, to effectively prevent deformation of the wiring board 10, it is desirable to form the first reinforcing plate 31 in a frame shape to completely surround the entire circumference of the inserting hole formation area 10b.

The second reinforcing plate 32 is a flat plate material and is formed by a material with sufficiently high rigidity (for example, stainless steel). As shown in FIGS. 2A, 2B, and 3C, the second reinforcing plate 32 is arranged on the lower surface of the first reinforcing plate 31. It is desirable to rigidly fix the second reinforcing plate 32 to the first reinforcing plate 31 by, for example, welding. The second reinforcing plate 32 includes a hole portion 32a for fitting a foot portion 33b of the spacer 33. The second reinforcing plate 32 also includes a plurality of bolt through holes 32b.

The second reinforcing plate 32 is arranged to cover the area surrounded by the first reinforcing plate 31. However, the second reinforcing plate 32 may include an opening within a range that allows the rigidity to be sufficiently high.

The first and second reinforcing plates 31 and 32 may be integrally molded.

The spacer 33 includes a head portion 33a with a large diameter and the foot portion 33b with a small diameter. As described, the foot portion 33b is fitted to the hole portion 32a of the second reinforcing plate 32 from above. It is desirable to form the spacer 33 by a material with high rigidity, such as a hard mold resin. The height of the head portion 33a is substantially the same as the thickness of the first reinforcing plate 31. As a result, when the substrate reinforcing structure 30 is attached to the wiring board 10, the head portion 33a of the spacer 33 is abutted to an area without the contact pins 20 (in the first embodiment, a non-forming area of the contact pin inserting holes 10a at the center of the inserting hole formation area 10b). As a result, the deformation of the wiring board 10 inside of the first reinforcing plate 31 can be effectively suppressed. However, in a case such as when the area of the IC socket 11 is small (therefore, when the area in the frame of the first reinforcing plate 31 is small), the deformation of the wiring board 10 can be sufficiently suppressed without the spacer 33. The spacer 33 can have any structure as long as the spacer 33 can be attached to the second reinforcing plate 32 to suppress the deformation of the wiring board 10.

The first insulating sheet 34 is arranged between the wiring board 10 and the first reinforcing plate 31 and is used to insulate the wiring board 10 and the first reinforcing plate 31 (see FIG. 1). The first insulating sheet 34 is formed by, for example, a resin and has substantially the same dimension and shape as those of the first reinforcing plate 31. The first insulating sheet 34 includes a plurality of bolt through holes 34a.

The second insulating sheet 35 is used to prevent conduction of the contact pins 20 and the second reinforcing plate 32. The second insulating sheet 35 is formed by, for example, a resin, and is arranged in a gap formed by the first and second reinforcing plates 31 and 32. The second insulating sheet 35 includes a through hole 35a. The foot portion 33b of the spacer 33 is fitted to the hole portion 32a of the second reinforcing plate 32 through the through hole 35a to hold the second insulating sheet 35 on the second reinforcing plate 32.

As described, the bolt through holes 10c, 31a, 32b, and 34a are provided in the wiring board 10, the first and second reinforcing plates 31 and 32, and the first insulating sheet 34. Bolts 36 are inserted to the bolt through holes 10c, 31a, 32b, and 34a from the back side of the second reinforcing plate 32, and the bolts 36 protrude to the front side of the wiring board 10. The nuts 37 are screwed and tightened, and the substrate reinforcing structure 30 is fixed to the wiring board 10.

Hereinafter, advantageous effects of the present invention will be described with reference to FIGS. 4A and 4B.

As described, when the IC package is accommodated in the accommodation portion 14 and pressed by the pressing member 16 as the IC socket 11 is mounted on the wiring board 10, the pressing force presses the contact pins 20 downward. Therefore, the base member 17 is deformed downward, and the lower contact portions 20b are pressed downward. As a result, the wiring board 10 is deformed into a shape as indicated by reference sign A in FIG. 4A.

Here, an example of a method of preventing and suppressing the deformation of the wiring board 10 includes a method of covering the back surface of the wiring board 10 by a flat plate for reinforcement (equivalent to the second reinforcing plate 32 of FIG. 1). However, in a case of a PTH (Pin Through Hole) substrate, the contact pins 20 and the solder protrude from the back surface of the substrate in the inserting hole formation area 10b, and a flat plate cannot be used for the reinforcement.

Meanwhile, a frame-like reinforcing plate (equivalent to the first reinforcing plate 31 of FIG. 1) surrounding the inserting hole formation area 10b can be attached to the back surface of the PTH wiring board 10. However, according to the investigation by the present inventors, the deformation of the wiring board 10 cannot be sufficiently suppressed only by the frame-like reinforcing plate.

Figure 4B:
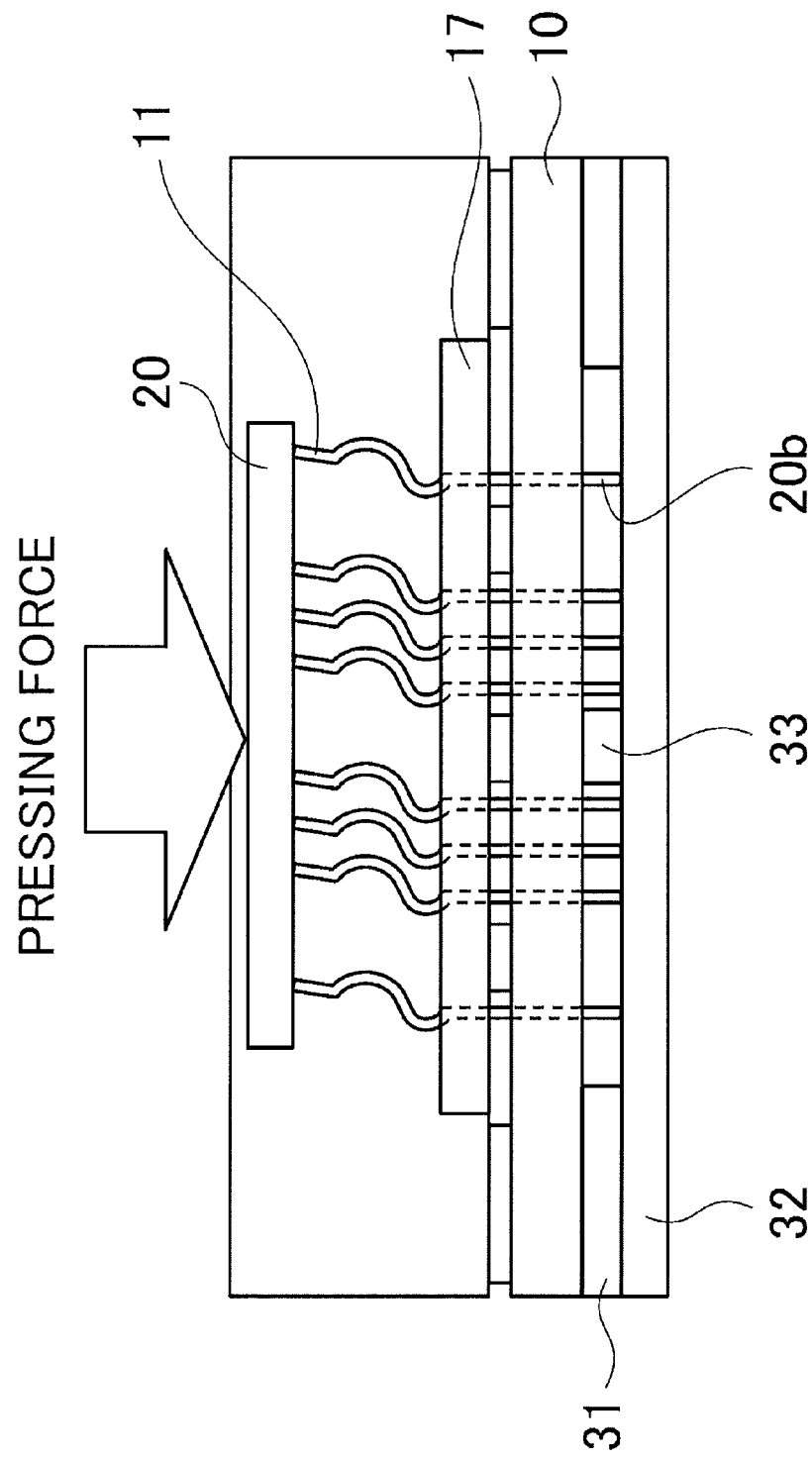
FIG. 4B is a cross-sectional view for describing the advantageous effects of the substrate reinforcing structure according to the first embodiment, showing the structure of the first embodiment.

On the other hand, the deformation of the wiring board 10 can be sufficiently suppressed by attaching the frame-like first reinforcing plate 31 to the back surface of the wiring board 10 and further fixing the flat second reinforcing plate 32 to the lower side of the first reinforcing plate 31 as shown in FIG. 4B.

Additionally, the deformation of the wiring board 10 inside of the first reinforcing plate 31 can be more effectively suppressed by providing the spacer 33 in an area without the formation of the contact pin inserting holes 10a as shown in FIG. 4B. Therefore, the deformation of the wiring board 10 can be sufficiently suppressed even if the area of the inserting hole formation area 10b (see FIGS. 2A to 2C) is large (therefore, the inside area of the first reinforcing plate 31 is large).

As described, according to the first embodiment, the first reinforcing plate 31 is attached to the lower side of the wiring board 10 so as to surround the inserting hole formation area 10b, and the second reinforcing plate 32 covering the first reinforcing plate 31 is further provided on the lower side of the first reinforcing plate 31. Therefore, even if the contact pins 20 protrude from the lower surface of the wiring board 10, the second reinforcing plate 32 can be attached without contacting the contact pins 20. The first and second reinforcing plates 31 and 32 can prevent and suppress the deformation of the wiring board 10.

Further, according to the first embodiment, the wiring board 10 can also be supported at the position provided with the spacer 33 in addition to the part provided with the first reinforcing plate 31 on the lower surface of the wiring board 10. Therefore, the deformation of the wiring board 10 can be sufficiently prevented and suppressed even if the area of the inserting hole formation area 10b is wide.

Furthermore, according to the first embodiment, the first reinforcing plate 31 is a frame-like flat plate, and the second reinforcing plate 32 is a flat plate. This further increases the advantageous effect of preventing and suppressing the deformation of the wiring board 10.

Furthermore, according to the first embodiment, the first insulating sheet 34 is provided between the wiring board 10 and the first reinforcing plate 31. Therefore, a short circuit or the like of the wiring board 10 does not occur even if the first reinforcing plate 31 is formed by a conductive material such as stainless steel.

In addition, according to the first embodiment, the second insulating sheet 35 is provided on the second reinforcing plate 32. This can prevent a contact pin 20 from coming into contact with the second reinforcing plate 32 and can prevent a short circuit with another contact pin 20.

REFERENCE SIGNS LIST 10 wiring board
10a contact pin insertion hole
10b insertion hole formation area
10c, 31a, 32b, 34a bolt insertion holes
11 IC socket
13 socket main body
14 housing portion
15 operation member
16 pressing member
17 base member
18 floating plate
20 contact pin
20a press-fitting portion
20b lower contact portion
20c upper contact portion
22c press-fitting hole
31 first reinforcing plate
32 second reinforcing plate
32a hole portion
33 spacer
33a head portion 33b foot portion
34 first insulating sheet
35 second insulating sheet
35a through hole

The invention claimed is:

1. A substrate reinforcing structure useable with a substrate including an inserting hole formation area provided with a plurality of contact pin inserting holes into which a plurality of contact pins are insertable and abutted to terminals of a single electric component, an upper surface of which an electric component socket is installed to accommodate the single electric component, and the plurality of contact pins of the single electric component socket are fixed in a state in which the plurality of contact pins are inserted to the contact pin inserting holes, wherein the substrate reinforcing structure comprising:
a first reinforcing plate attached to a lower surface side of the substrate so as to surround the inserting hole formation area which corresponds to the single electric component; and
a second reinforcing plate directly fixed on a lower side of the first reinforcing plate so as to cover an area surrounded by the first reinforcing plate.

2. The substrate reinforcing structure according to claim 1, further comprising:
a spacer attached to an upper surface of the second reinforcing plate to support a lower surface of the substrate in the area surrounded by the first reinforcing plate and at a position without the insertion of the plurality of contact pins.

3. The substrate reinforcing structure according to claim 1, wherein
the first reinforcing plate is a frame-like flat plate surrounding an entire circumference of the inserting hole formation area, and
the second reinforcing plate is a flat plate blocking the area surrounded by the first reinforcing plate.

4. The substrate reinforcing structure according to claim 1, wherein an insulating sheet is arranged between the lower surface of the substrate and an upper surface of the first reinforcing plate.

5. A substrate reinforcing structure used to a substrate including an inserting hole formation area provided with a plurality of contact pin inserting holes, an upper surface of which an electric component socket is installed, and contact pins of the electric component socket are fixed in a state in which the contact pins are inserted to the plurality of contact pin inserting holes, wherein the substrate reinforcing structure comprises:
a first reinforcing plate attached to a lower surface side of the substrate so as to surround the inserting hole formation area; and
a second reinforcing plate provided on a lower side of the first reinforcing plate so as to cover an area surrounded by the first reinforcing plate, and
an insulating sheet is arranged on an upper surface of the second reinforcing plate.

\* \* \* \* \*